United States Patent (10) Patent No.: US 9,598,528 B2
Gunji et al. (45) Date of Patent: Mar. 21, 2017

(54) MODIFIED EPOXY RESIN COMPOSITION

(75) Inventors: Yasuhiro Gunji, Chiyoda-ku (JP);
Toshiaki Takeyama, Funabashi (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 802 days.

(21) Appl. No.: 11/575,939

(22) PCT Filed: Sep. 21, 2005

(86) PCT No.: PCT/JP2005/017353
§ 371 (c)(1),
(2), (4) Date: Mar. 23, 2007

(87) PCT Pub. No.: WO2006/035641
PCT Pub. Date: Apr. 6, 2006

(65) Prior Publication Data
US 2007/0249760 A1 Oct. 25, 2007

(30) Foreign Application Priority Data
Sep. 29, 2004 (JP) .................................. 2004-283094

(51) Int. Cl.
C08L 63/06 (2006.01)
C08G 18/50 (2006.01)
C08G 101/00 (2006.01)
C08K 5/103 (2006.01)
H05K 3/28 (2006.01)

(52) U.S. Cl.
CPC .......... *C08G 18/5027* (2013.01); *C08L 63/06* (2013.01); *C08G 2101/005* (2013.01); *C08G 2101/0025* (2013.01); *C08G 2101/0083* (2013.01); *C08G 2330/00* (2013.01); *C08K 5/103* (2013.01); *H05K 3/284* (2013.01); *H05K 3/285* (2013.01)

(58) Field of Classification Search
CPC .............................. C08L 63/06; C09D 163/06
USPC ........................................................ 523/456
See application file for complete search history.

(56) References Cited

U.S. PATENT DOCUMENTS 3,496,122 A * 2/1970 Niklaus et al. ................ 528/297
3,799,900 A * 3/1974 Weinrich ...................... 528/363
5,623,031 A * 4/1997 Imura et al. ................... 525/489
5,623,086 A * 4/1997 Perri et al. ..................... 560/240
6,177,541 B1 * 1/2001 Ikeda et al. .................... 528/487

FOREIGN PATENT DOCUMENTS

| CN | ZL 2005 8 0032325.7 | 9/2005 |
|---|---|---|
| EP | 1 795 558 B1 | 12/2009 |
| JP | 61 271318 | 12/1986 |
| JP | 2 275867 | 11/1990 |
| JP | 2 279684 | 11/1990 |
| JP | 4 81420 | 3/1992 |
| JP | 4 264123 | 9/1992 |
| JP | 6 192396 | 7/1994 |
| JP | 6 68014 | 8/1994 |
| JP | 7 62060 | 3/1995 |
| JP | 11-508921 | 8/1999 |

OTHER PUBLICATIONS

Office Action issued Jan. 31, 2012 in Japanese Patent Application No. 2006-537689 (with English translation).

* cited by examiner

*Primary Examiner* — Liam J Heincer
(74) *Attorney, Agent, or Firm* — Oblon, McClelland, Maier & Neustadt, L.L.P.

(57) ABSTRACT

A crystalline epoxy resin is modified to provide an epoxy resin composition capable of producing a cured product with excellent cured product properties.
The modified epoxy resin composition comprises compound A having in its molecule a functional group represented by formula (1):

$$-CH_2-CH-CH_2 \atop {\underset{O-C-R^1}{\overset{O-C-R^2}{|}}\atop \overset{\|}{O}}$$ Formula (1)

(where each of $R^1$ and $R^2$ is an alkyl group, an alkenyl group, an alkynyl group, an aryl group, an aralkyl group, a heterocyclic group, or a halogenated, aminated or nitrated derivative thereof), and compound B having a glycidyl group in its molecule. The compound A is preferably a compound resulting from replacement of from at least one to at most n glycidyl groups among n glycidyl groups in a molecule (where n is an integer of from 2 to 16) with the functional group of the formula (1). The compound B is preferably a compound having n glycidyl groups (where n is an integer of from 2 to 16) in its molecule.

11 Claims, No Drawings

MODIFIED EPOXY RESIN COMPOSITION

TECHNICAL FIELD

The present invention relates to a modified epoxy resin which is modified without considerably impairing the inherent cured product properties of a polyfunctional epoxy resin, so as to improve water absorption resistance, mechanical properties, etc., thereby expanding its application range.

BACKGROUND ART

A crystalline epoxy resin generally has high heat resistance because of its rigid main chain skeleton and polyfunctionality, and is used in fields requiring heat resistant reliability, such as electric and electronic fields.

However, there are fields wherein a liquid composition must be used in molding, e.g., cast molding, depending on applications, and the crystalline epoxy resin is mainly used in applications using a solid material, e.g., transfer molding.

Furthermore, the conventional epoxy resin to be used for the liquid molding such as cast molding is a liquid epoxy resin, which cannot sufficiently meet a demand for improvement in cured product properties such as heat resistance, more severely required recently in fields of adhesion, cast molding, sealing, molding, laminating, and so on. Therefore, there are increasing demands for liquefying a crystalline polyfunctional epoxy resin which provides cured product properties including high heat resistance. On the other hand, there are also increasing demands for stability of a cured product in short-wavelength regions such as white LED and blue LED.

Patent Document 1 describes that a liquid modified epoxy resin is obtained by reacting a crystalline epoxy resin with a compound having at least two phenolic hydroxyl and/or carboxyl groups in one molecule and a compound having one phenolic hydroxyl group and/or carboxyl group in one molecule.

Patent Document 2 discloses a process for producing a liquid epoxy resin composition with fluidity at room temperature, wherein a mixture containing a crystalline epoxy resin and a liquid acid anhydride curing agent is melted and mixed at a temperature higher than the melting point of the epoxy resin for at least 10 minutes to cause reaction of the mixture, thereby obtaining a noncrystalline epoxy resin.

Patent Document 3 discloses a tris-(2,3-epoxypropyl)-isocyanurate composition which is liquid at room temperature, and which comprises 100 parts by weight of a low-melting point stereoisomer of tris-(2,3-epoxypropyl-isocyanurate with a melting point of from 98 to 107° C. and an epoxy value of at least 9.9, and such parts by weight of a carboxylic anhydride as a curing agent that a ratio thereof is 0.5 to 1.5 per epoxy group in the entire epoxy resin.

Patent Document 4 discloses a method for preventing crystallization, as a method for preventing solidification due to recrystallization of a liquid composition containing a trivalent epoxy compound with a triazine skeleton and an acid anhydride curing agent, characterized in that a water content in the composition is adjusted to at most 0.5% by weight.

Patent Document 1: JP-A-7-62060 (scope of claims)
Patent Document 2: JP-B-6-68014 (scope of claims)
Patent Document 3: JP-A-4-264123 (scope of claims)
Patent Document 4: JP-A-4-81420 (scope of claims)

DISCLOSURE OF THE INVENTION

Object to be Accomplished by the Invention

Recently, the required properties have become severer for epoxy resin cured products to be used for e.g. high integration of circuits or use of lead-free solders, particularly in the electric and electronic fields. Thus, it is becoming more difficult for the conventional modified epoxy resins to meet the above-mentioned properties (heat resistance, water absorption resistance and mechanical properties).

Liquid epoxy resins are used for potting, coating, casting and the like thanks to features of their good handling, few troubles during production such as increase of viscosity due to crystallization, and so on.

There are increasing demands for expansion of the application range of use by liquefying a crystalline epoxy resin providing a cured product with excellent properties such as high heat resistance, e.g., a polyfunctional epoxy resin.

Furthermore, there are increasing demands for an epoxy resin improved in disadvantages of water absorption and low mechanical strength while maintaining the heat resistance and others as advantages of a polyfunctional epoxy resin cured product.

In order to achieve the above demand properties the present invention provides an epoxy resin composition in a liquid or solid state with improved cured product properties such as excellent water absorption resistance, mechanical properties and so on, based on modification of a crystalline epoxy resin.

Means to Accomplish the Object

The present invention resides in the gists of the following features.

(1) A modified epoxy resin composition comprising compound A having in its molecule a functional group represented by formula (1):

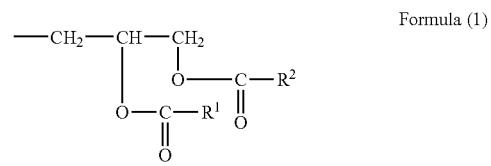

Formula (1)

(where each of $R^1$ and $R^2$ is an alkyl group, an alkenyl group, an alkynyl group, an aryl group, an aralkyl group, a heterocyclic group, or a halogenated, aminated or nitrated derivative thereof), and compound B having a glycidyl group in its molecule.

(2) The modified epoxy resin composition according to the above (1), wherein the compound A is a compound resulting from replacement of from at least one to at most n glycidyl groups among n glycidyl groups in a molecule (where n is an integer of from 2 to 16) with the functional group of the formula (1).

(3) The modified epoxy resin composition according to the above (1) or (2), wherein the compound B is a compound having n glycidyl groups (where n is an integer of from 2 to 16) in its molecule.

(4) The modified epoxy resin composition according to the above (2) or (3), wherein n is 3.

(5) The modified epoxy resin composition according to any one of the above (1) to (4), wherein a molar ratio of the compound A:the compound B is 1:0.3-1.5.

(6) The modified epoxy resin composition according to any one of the above (1) to (5), wherein the compound A is a compound resulting from replacement of a glycidyl group of tris-(2,3-epoxypropyl)-isocyanurate with the functional group of the formula (1).

(7) The modified epoxy resin composition according to any one of the above (1) to (6), wherein the compound B is a tris-(2,3-epoxypropyl)-isocyanurate.

(8) The modified epoxy resin composition according to the above (6) or (7), wherein the tris-(2,3-epoxypropyl)-isocyanurate is α-type tris-(2,3-epoxypropyl)-isocyanurate.

(9) A process for producing the modified epoxy resin composition as defined in any one of the above (1) to (8), comprising a reaction of the compound B: an acid anhydride in a molar ratio of (the glycidyl group in the compound B):(the acid anhydride) being 1:01-0.5.

Effects of the Invention

The modified epoxy resin composition of the present invention is liquid or solid at room temperature and excellent in its stability, and excellent in the heat resistance peculiar to the polyfunctional epoxy resin cured product and provides the cured product properties of improved water absorption and mechanical strength. The modified epoxy resin composition of the present invention is applicable in application fields such as cast molding, transfer molding and so on.

BEST MODE FOR CARRYING OUT THE INVENTION

The present invention resides in a modified epoxy resin composition comprising compound A having a functional group represented by formula (1) in its molecule and compound B having a glycidyl group in its molecule.

The compound A is a compound resulting from replacement of from at least one to at most n glycidyl groups among n glycidyl groups in a molecule (where n is an integer of from 2 to 16) with the functional group of the formula (1).

Furthermore, the compound B is a compound having n glycidyl groups in its molecule (where n is an integer of from 2 to 16).

An epoxy compound as a raw material for the above compound A is also an epoxy compound of the compound B, and it is, for example, one or epoxy resins produced from epihalohydrins and various types of phenol compounds such as various phenols, e.g., bisphenol A, bisphenol F, bisphenol AD, resorcin, methylresorcin, dihydroxynaphthalene, a phenol novolak resin, a cresol novolak resin, a bisphenol A novolak resin, a dicyclopentadiene phenol resin, a terpene phenol resin, a phenol aralkyl resin, a naphthol novolak resin, and so on; and polyvalent phenol resins obtained by condensation of these various phenols with various aldehydes, e.g., hydroxybenzaldehyde, crotonaldehyde, glyoxal, and so on. Other examples include epoxy resins produced from epihalohydrins and various amine compounds such as diaminodiphenylmethane, aminophenol and xylene diamine. Still other examples include epoxy resins produced from epihalohydrins and various carboxylic acids such as methylhexahydroxyphthalic acid and dimer acid.

In the modified epoxy resin composition of the present invention, a molar ratio of the compound A:the compound B is preferably 1:0.3-1.5.

The modified epoxy resin composition of the present invention is obtained by reaction of the compound B:the acid anhydride in a molar ratio of (glycidyl group in the compound B):(acid anhydride) being 1:0.1-0.5.

In the epoxy compound as the raw material for the compound A, and the epoxy compound of the compound B in the present invention, n is preferably from 2 to 4 and n is particularly preferably 3. Furthermore, the epoxy compound as the raw material for the compound A, and the epoxy compound of the compound B to be preferably used are tris-(2,3-epoxypropyl)-isocyanurate. Use of tris-(2,3-epoxypropyl)-isocyanurate provides a cured product excellent in light resistance, weather resistance, heat resistance, transparency, and so on.

Namely, the compound A is a compound obtained by replacing a glycidyl group or glycidyl groups in tris-(2,3-epoxypropyl)-isocyanurate with the functional group of the formula (1). Moreover, the compound B is tris-(2,3-epoxypropyl)-isocyanurate.

The present invention will be described in further detail with reference to an example of tris-(2,3-epoxypropyl)-isocyanurate as the compound having glycidyl groups in its molecule.

Tris-(2,3-epoxypropyl)-isocyanurate is a highly crystalline epoxy resin having three glycidyl groups in one molecule.

The present invention provides the modified epoxy resin composition containing tris-(2,3-epoxypropyl)-isocyanurate whose glycidyl group or glycidyl groups are replaced with the functional group represented by the formula (1), and tris-(2,3-epoxypropyl)-isocyanurate.

The compound A is preferably a mixture of a compound having one acid anhydride of formula (2) below, a compound having two acid anhydrides of formula (2), and a compound having three acid anhydrides of formula (2), added to the glycidyl group(s) in tris-(2,3-epoxypropyl)-isocyanurate.

The liquid epoxy resin composition of the present invention is preferably obtained by reacting tris-(2,3-epoxypropyl)-isocyanurate with the acid anhydride in a molar ratio of the glycidyl groups in tris-(2,3-epoxypropyl)-isocyanurate the acid anhydride of 1:0.1-0.5. Furthermore, it is preferred to obtain a modified epoxy resin composition containing a mixture (the compound A) of compounds having one acid anhydride, two acid anhydrides and three acid anhydrides of formula (2) added to the glycidyl group(s) in tris-(2,3-epoxypropyl)-isocyanurate, and tris-(2,3-epoxypropyl),-isocyanurate (compound B) in a molar ratio of (compound A):(compound B) being 1:0.3-1.5.

The acid anhydride of formula (2) used in the present invention is a so-called acid anhydride obtainable from two molecules of a monocarboxylic acid or monocarboxylic acids, and does not function as a curing agent for epoxy resin, which is different from an acid anhydride obtainable from a dicarboxylic acid and used as a curing agent for epoxy resin.

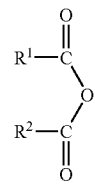

Formula (2)

A total number of glycidyl groups in the synthesized compound A and in the compound B is preferably at least two on average in terms of one molecule (when the total number of glycidyl groups is divided by the total number of molecules). If the total number is less than 2, a cured product will show degradation of properties, particularly heat resistances which is undesirable.

There are no particular restrictions on the acid anhydride of formula (2) to be used in the present invention, and each of $R^1$ and $R^2$ which are independent of each other. Is an alkyl group, an alkenyl group, an alkynyl group, an aryl group, an aralkyl group, a heterocyclic group, or a halogenated, aminated or nitrated derivative thereof. The alkyl group is one with a carbon number of from 1 to 18 and examples of the alkyl group include a methyl group, an ethyl group, an n-propyl group, an isopropyl group, an n-butyl group, an isobutyl group, a t-butyl group, an n-heptyl group, a cyclohexyl group, and so on. The alkenyl group is one with a carbon number of from 2 to 6 and examples of the group include a vinyl group, 1-propenyl group, 2-propenyl group, and so on. The alkynyl group is one with a carbon number of from 2 to 6 and examples of the group include an ethynyl group, a propargyl group, and so on. The aryl group is one with a carbon number of from 6 to 20 and examples of the group include a phenyl group, a tolyl group, a naphthyl group, a methyl naphthyl group, an anthryl group, an ethyl anthryl group, and so on. The aralkyl group is one with a carbon number of from 7 to 22 and examples of the group include a benzyl group, a phenethyl group, a naphthyl methyl group, a naphthyl ethyl group, an anthryl group, an anthryl methyl group, and so on. Examples of the heterocyclic group include an imidazole group, a pyrazole group, a pyridazine group, a pyrimidine group, a quinoline group, a benzoxazole group, a thiophene group, a dithiol group, a thiazole group, a thiadiazole group, a benzothiazole group, and so on. These alkyl group, alkenyl group, alkynyl group, aryl group, aralkyl group and heterocyclic group may also be used in the form of a halogenated (fluorinated brominated, or iodinated), aminated or nitrated derivative group. Examples thereof include a chloromethyl group, a dichloromethyl group, a trichloromethyl group, a trifluoromethyl group, an aminophenyl group, a nitrobenzyl group and so on. $R^1$ and $R^2$ may be the same or different from each other. Examples of the acid anhydride of formula (2) with $R^1$ and $R^2$ include acetic anhydride, propionic anhydride, n-butyric anhydride, n-valeric anhydride, n-hexanoic anhydride, trifluoroacetic anhydride, and so on. $R^1$ and $R^2$ in formula (1) are determined based on a kind of the acid anhydride of formula (2), and each of $R^1$ and $R^2$ is preferably a hydrocarbon group with a carbon number of from 1 to 5.

In a case where a composition produced with tris-(2,3-epoxypropyl)-isocyanurate as the highly crystalline epoxy resin is liquid it is preferred to use a low-melting point stereoisomer of tris-(2,3-epoxypropyl)-isocyanurate.

Tris-(2,3-epoxypropyl)-isocyanurate synthesized from isocyanuric acid and epichlorohydrin is a mixture containing a low-melting point stereoisomer of tris-2,3-epoxypropyl)-isocyanurate (α-type crystal called "α-type" hereinafter) and a high-melting point stereoisomer of tris-(2,3-epoxypropyl)-isocyanurate (β-type crystal, called "β-type" hereinafter) in a ratio of 3:1. This is because the raw material epichlorohydrin is an equimolar mixture of R- and S-optical isomers. Since three molecules of epichlorohydrin are added to one molecule of tris-(2,3-epoxypropyl)-isocyanurate synthesized, eight kinds of tris-(2,3-epoxypropyl)-isocyanurate, i.e. RRR, SSS, RSS, SSR, SRS, RRS, RSR and SRR, are equally produced. Tris-(2,3-epoxypropyl)-isocyanurate forming a crystal from a combination of RRR and SSS is β-type tris-(2,3-epoxypropyl)-isocyanurate, and one forming a crystal with combination of the other six kinds of tris-(2,3-epoxypropyl)-isocyanurate is α-type tris-(2,3-epoxypropyl)-isocyanurate; therefore, crystals are produced in the above-mentioned ratio.

Incidentally, α-type tris-(2,3-epoxypropyl)-isocyanurate has a melting point of from 98 to 107° C. (a value measured by an automatic melting point measuring method Mettler at a temperature-raising rate of 2° C./min; the same applies below), and has considerably high solubility in a solvent as compared with β-type tris-(2,3-epoxypropyl)-isocyanurate having a melting point of from 152 to 158° C. These differences originate in the difference in interaction among molecules of tris-(2,3-epoxypropyl)-isocyanurate forming the α-type crystal and β-type crystal, and mean that the β-type crystal has higher crystallinity. Namely, in a case where tris-(2,3-epoxypropyl)-isocyanurate is used for the modified epoxy resin composition of the present invention, the raw material preferably used is α-type tris-(2,3-epoxypropyl)-isocyanurate because unreacted tris-(2,3-epoxypropyl)-isocyanurate of α-type is less likely to crystallize.

Now the reaction of tris-(2,3-epoxypropyl)-isocyanurate and an acid anhydride will be described.

A solvent to be used for the reaction may be one inert to the reaction. Representative examples of the solvent include ketones such as acetone and methyl ethyl ketone, nitrites such as acetonitrile, ethers such as tetrahydrofuran and dioxane, esters such as ethyl acetate, aromatic hydrocarbons such as chlorobenzene and toluene, and halogenated hydrocarbons such as chloroform and dichloroethane. These solvents are used alone or in combination as a solvent mixture, and tris-(2,3-epoxypropyl)-isocyanurate is dissolved therein. A catalyst can be used if necessary as one selected from tertiary amines such as triethylamine, tripropylamine and 1,8-diazabicyclo-5,4,0-undecane-7-ene, quaternary phosphonium salts such as halogenated triphenylmonoalkyl phosphoniums typified by triphenylethylphosphonium bromide and the like, imidazole compounds such as 2-ethyl-4-methyl-imidazole, quaternary ammonium salts such as tetraethylammonium bromide, and phosphorus compounds such as triphenylphosphine.

The reaction is carried out at a reflux temperature of the solvent until an epoxy group content titrated with 0.1 N-perchloric acid/acetic acid solution reaches a theoretical figure (a value when the acid anhydride added is used up by the reaction). After completion of the reaction, the solvent is distilled off to obtain a modified epoxy resin composition.

It was found by HPLC analysis that the modified epoxy resin composition obtained was one containing a mixture of compounds having one acid anhydride, two acid anhydrides, and three acid anhydrides of formula (2) added to the glycidyl group(s) in tris-(2,3-epoxypropyl)-isocyanurate (compound A), and unreacted tris-(2,3-epoxypropyl)-isocyanurate (compound B).

In the present invention, the composition will never turn into a gel even after stored as mixed with an acid anhydride curing agent because there is no hydroxyl group produced by ring-opening of an epoxy group, different from cases where a monocarboxylic acid is added to an epoxy resin. Namely, in a case where one or more of epoxy groups are modified with a monocarboxylic acid, when an acid anhydride curing agent is used to obtain a cured product, hydroxyl groups produced by ring-opening of the epoxy groups promote the reaction and are dissolved in the acid anhydride curing agent, whereby the composition turns into a gel even if stored at room temperature. Furthermore, the acid anhydride of the modifying compound used in the present invention is different from the anhydride of dicarboxylic acid normally used as a curing agent for epoxy resin, and reacts with tris-(2,3-epoxypropyl)-isocyanurate to form a modified tris-(2,3-epoxypropyl)-isocyanurate, which causes no reaction during storage or under heat, and which is free of concern about gelation.

An advantage of use of tris-(2,3-epoxypropyl)-isocyanurate as the highly crystalline epoxy resin is to provide a cured product excellent not only in the heat resistance but also in the weather resistance, light resistance and transparency. Namely, since tris-(2,3-epoxypropyl)-isocyanurate has a triazine skeleton, it absorbs less UV and is less likely to undergo oxidative decomposition than many epoxy resins having an aromatic ring, whereby the cured product is less colored by UV irradiation and highly transparent.

Furthermore, since one or more of glycidyl groups are modified, an improvement is made in properties such as high water absorption and mechanical strength which are drawbacks of polyfunctional epoxy cured products. Namely, the cured product from the modified epoxy resin composition of the present invention provides a cured product with low water absorption and high mechanical strength while maintaining the high heat resistance. The modified epoxy resin composition of the present invention is mixed, if necessary, with a liquid acid anhydride curing agent to be dissolved and used. The liquid acid anhydride used herein is an acid anhydride normally used as the curing agent for epoxy resin. For example, the liquid acid anhydride used is at least one member selected from the group consisting of methylhimic anhydride, methylhexahydrophthalic anhydride, methyltetrahydrophthalic anhydride, and so on, which are used alone or as a mixture of two or more of them.

The modified epoxy resin composition of the present invention can be used as dissolved in a commercially available epoxy resin which is liquid at room temperature. A mixing ratio is optionally determined and preferably at most 100 parts by weight of the liquid epoxy resin relative to 100 parts by weight of the modified epoxy resin composition of the present invention. If the amount exceeds 100 parts by weight, it will result in degradation of the performance of the modified epoxy resin composition inherent to the present invention. There are no particular restrictions on the epoxy resin which is liquid at room temperature, used here. Examples of the resin include bisphenol-A-type liquid epoxy resin bisphenol-F-type liquid epoxy resin, hexahydrobisphenol-A-type liquid epoxy resin, dimer acid glycidyl ester, and so on.

A curing agent to be used for curing the modified epoxy resin composition of the present invention may be one of curing agents generally used for epoxy resins. Examples of the agent include phenol resins such as phenol novolak resin and cresol novolak resin, acid anhydrides such as methylhimic anhydride, methylhexahydrophthalic anhydride, hexahydrophthalic anhydride, methyltetrahydrophthalic anhydride, tetrahydrophthalic anhydride and pyromellitic anhydride, and amines such as diethylene triamine, isophorone diamine, diaminodiphenylmethane and diaminodiphenyl sulfone.

Furthermore, in producing the cured product as described above, a curing accelerator may be optionally used in combination. Examples of the curing accelerator include imidazoles such as 2-methyl imidazole and 2-ethyl-4-methyl imidazole, amines such as 2,4,6-tris(dimethylaminoethyl) phenol and benzyldimethylamine, organic phosphorus compounds such as triphenylphosphine and tributyl phosphine, and quaternary phosphonium salts such as halogenated triphenylmonoalkylphosphoniums typified by triphenylethylphosphonium bromide.

EXAMPLES

Synthesis Example 1

60 g of α-type tris-(2,3-epoxypropyl)-isocyanurate (epoxy value: 9.95 eq/kg) and 54 g of toluene were charged in a reactive flask equipped with a condenser, a thermometer and a stirring equipment, heated to the reflux temperature and completely dissolved.

Then, 12.31 g of a solution of acetic anhydride (reagent) having 0.06 g of triphenylethylphosphonium bromide dissolved as a reaction catalyst was dropwise added in the above reaction system over a period of ten minutes. After completion of the dropwise addition, the mixture was reacted at the reflux temperature for two hours. After confirming that the epoxy value of the reaction solution became 3.78 eq/kg (theoretical figure: 3.76 eq/kg), toluene was distilled off to obtain 72.2 g of a liquid modified epoxy resin composition.

The epoxy value of the product was 6.68 eq/kg (theoretical value: 6.64 eq/kg). It was confirmed by HPLC analysis that a ratio of tris-(2,3-epoxypropyl)-isocyanurate (non-adduct): mono-adduct of acetic anhydride to tris-(2,3-epoxypropyl)-isocyanurate: bis-adduct of acetic anhydride to tris-(2,3-epoxypropyl)-isocyanurate: tri-adduct of acetic anhydride to tris-(2,3-epoxypropyl)-isocyanurate was 49.5:39.7:10.8:0 as a molar ratio.

Synthesis Example 2

60 g of α-type tris-(2,3-epoxypropyl)-isocyanurate (epoxy value: 9.9 eq/kq) and 54 g of toluene were charged in a reactive flask equipped with a condenser, a thermometer and a stirring equipment, heated to the reflux temperature and completely dissolved.

Next, 14.50 g of a solution of acetic anhydride (reagent) having 0.06 g of triphenylethylphosphonium bromide dissolved as a reaction catalyst was dropwise added in the above reaction system over a period of ten minutes. After completion of the dropwise addition, the mixture was reacted at the reflux temperature for two hours. After confirming that the epoxy value of the reaction solution became 3.67 eq/kg (theoretical figure: 3.66 eq/kg), toluene was distilled off to obtain 74.4 g of a liquid modified epoxy resin composition.

The epoxy value of the product was 6.32 eq/kg (theoretical value: 6.31 eq/kg). It was confirmed by HPLC analysis that a ratio of tris-(2,3-epoxypropyl)-isocyanurate (non-adduct): mono-adduct of acetic anhydride to tris-(2,3-epoxypropyl)-isocyanurate: bis-adduct of acetic anhydride to tris-(2,3-epoxypropyl)-isocyanurate: tri-adduct of acetic anhydride to tris-(2,3-epoxypropyl)-isocyanurate was 40.3:44.6:13.4:1.7 as a molar ratio.

Synthesis Example 3

60 g of α-type tris-(2,3-epoxypropyl)-isocyanurate (epoxy value: 9.95 eq/kg) and 54 g of toluene were charged in a reactive flask equipped with a condenser, a thermometer and a stirring equipment, heated to the reflux temperature and completely dissolved.

Then, 16.46 g of a solution of acetic anhydride (reagent) having 0.06 g of triphenylethylphosphonium bromide dissolved as a reaction catalyst was dropwise added in the above reaction system over a period of ten minutes. After completion of the dropwise addition, the mixture was reacted at the reflux temperature for two hours. After confirming that the epoxy value of the reaction solution became 3.46 eq/kg (theoretical value: 3.44 eq/kg), toluene was distilled off to obtain 76.3 g of a liquid modified epoxy resin composition.

The epoxy value of the product was 5.78 eq/kg (theoretical value: 5.76 eq/kg). It was confirmed by HPEC analysis that a ratio of tris-(2,3-epoxypropyl)-isocyanurate (non-adduct): mono-adduct of acetic anhydride to tris-(2,3-epoxypropyl)-isocyanurate: bis-adduct of acetic anhydride to tris-(2,3-epoxypropyl)-isocyanurate: tri-adduct of acetic anhydride to tris-(2,3-epoxypropyl)-isocyanurate was 35.1:45.4:16.5:3.0 as a molar ratio.

Synthesis Example 4

60 g of α-type tris-(2,3-epoxypropyl)-isocyanurate (epoxy value: 9.95 eq/kg) and 54 g of toluene were charged in a reactive flask equipped with a condenser, a thermometer and a stirring equipment, heated to the reflux temperature and completely dissolved. Then, 18.23 g of a solution of propionic anhydride (reagent) having 0.06 g of triphenylethylphosphonium bromide dissolved as a reaction catalyst was dropwise added in the above reaction system in ten minutes. After completion of the dropwise addition, the mixture was reacted at the reflux temperature for two hours. After confirming that the epoxy value of the reaction solution became 3.58 eq/kg (theoretical value: 3.55 eq/kg), toluene was distilled off to obtain 78.1 g of a liquid modified epoxy resin composition.

The epoxy value of the product was 6.03 eq/kg (theoretical value: 6.01 eq/kg). It was confirmed by HPLC analysis that a ratio of tris-(2,3-epoxypropyl)-isocyanurate (non-adduct): mono-adduct of propionic anhydride to tris-(2,3-epoxypropyl)-isocyanurate: bis-adduct of propionic anhydride to tris-(2,3-epoxypropyl)-isocyanurate: tri-adduct of propionic anhydride to tris-(2,3-epoxypropyl)-isocyanurate was 42.8:43.6:12.4:1.2 as a molar ratio.

Synthesis Example 5

60 g of α-type tris-(2,3-epoxypropyl)-isocyanurate (epoxy value: 9.95 eq/kg) and 54 g of toluene were charged in a reactive flask equipped with a condenser, a thermometer and a stirring equipment, heated to the reflux temperature and completely dissolved. Then, 21.23 g of a solution of propionic anhydride (reagent) having 0.06 g of triphenylethylphosphonium bromide dissolved as a reaction catalyst was dropwise added in the above reaction system over a period of ten minutes. After completion of the dropwise addition, the mixture was reacted at the reflux temperature for two hours. After confirming that the epoxy value of the reaction solution became 3.35 eq/kg (theoretical value: 3.31 eq/kg), toluene was distilled off to obtain 81.1 g of a liquid modified epoxy resin composition.

The epoxy value of the product was 5.52 eq/kg (theoretical value: 5.50 eq/kg) It was confirmed by HPLC analysis that a ratio of tris-(2,3-epoxypropyl)-isocyanurate (non-adduct): mono-adduct of propionic anhydride to tris-(2,3-epoxypropyl)-isocyanurate: bis-adduct of propionic anhydride to tris-(2,3-epoxypropyl)-isocyanurate: tri-adduct of propionic anhydride to tris-(2,3-epoxypropyl)-isocyanurate was 33.3:45.4:18.6:2.7 as a molar ratio.

Synthesis Example 6

60 g of α-type tris-(2,3-epoxypropyl)-isocyanurate (epoxy value: 9.95 eq/kg) and 54 g of toluene were charged in a reactive flask equipped with a condenser, a thermometer and a stirring equipment, heated to the reflux temperature and completely dissolved. Then, 7.26 g of a solution of acetic acid (reagent) having 0.06 g of triphenylethylphosphonium bromide dissolved as a reaction catalyst was dropwise added in the above reaction system over a period of ten minutes. After completion of the dropwise addition, the mixture was reacted at the reflux temperature for two hours. After confirming that the epoxy value of the reaction solution became 4.07 eq/kg (theoretical value: 4.04 eq/kg), toluene was distilled off to obtain 67.1 g of a liquid modified epoxy resin composition.

The epoxy value of the product was 7.14 eq/kg (theoretical value: 7.14 eq/kg). It was confirmed by HPLC analysis that a ratio of tris-(2,3-epoxypropyl)-isocyanurate (non-adduct): mono-adduct of acetic acid to tris-(2,3-epoxypropyl)-isocyanurate: bis-adduct of acetic acid to tris-(2,3-epoxypropyl)-isocyanurate: tri-adduct of acetic acid to tris-(2,3-epoxypropyl)-isocyanurate was 49.9:35.4:13.0:1.7 as a molar ratio.

Synthesis Example 7

60 g of α-type tris-(2,3-epoxypropyl)-isocyanurate (epoxy value: 9.95 eq/kg) and 54 g of toluene were charged in a reactive flask equipped with a condenser, a thermometer and a stirring equipment, heated to the reflux temperature and completely dissolved. Then, 9.67 g of a solution of acetic acid (reagent) having 0.06 g of triphenylethylphosphonium bromide dissolved as a reaction catalyst was dropwise added in the above reaction system over a period of ten minutes. After completion of the dropwise addition, the mixture was reacted at the reflux temperature for two hours. After confirming that the epoxy value of the reaction solution became 3.65 eq/kg (theoretical value: 3.61 eq/kg), toluene was distilled off to obtain 69.5 g of a liquid modified epoxy resin composition.

The epoxy value of the product was 6.44 eq/kg (theoretical value: 6.41 eq/kg). It was confirmed by HPLC analysis that a ratio of tris-(2,3-epoxypropyl)-isocyanurate (non-adduct): mono-adduct of acetic acid to tris-(2,3-epoxypropyl)-isocyanurate: bis-adduct of acetic acid to tris-2,3-epoxypropyl)-isocyanurate: tri-adduct of acetic acid to tris-(2,3-epoxypropyl)-isocyanurate was 40.2:37.5:17.9:4.4 as a molar ratio.

Synthesis Example 8

60 g of α-type tris-(2,3-epoxypropyl)-isocyanurate (epoxy value: 9.95 eq/kg) and 54 g of toluene were charged in a reactive flask equipped with a condenser, a thermometer and a stirring equipment, heated to the reflux temperature and completely dissolved. Then, 10.50 g of a solution of propionic acid (reagent) having 0.06 g of triphenylethylphosphonium bromide dissolved as a reaction catalyst was dropwise added in the above reaction system over a period of ten minutes. After completion of the dropwise addition, the mixture was reacted at the reflux temperature for two hours. As the reaction proceeded, a white insoluble unmelted solid product was obtained.

Storage stability and cured product properties were measured for the above liquid modified epoxy resin compositions.

(Storage Stability Test)

A solution adjusted to an equivalent of methylhexahydrophthalic anhydride/an equivalent of epoxy resin=0.5 was used as a sample. Viscosity was measured at 60° C. by means of an E-type viscometer. The above sample was stored under stirring at room temperature and a number of days to loss of fluidity due to crystallization was determined by visual observation and regarded as an evaluation of storage stability.

A curing agent used was methylhexahydrophthalic anhydride in an equivalent equal to that of the epoxy resin, and triphenylbenzylphosphonium bromide (SA5003: manufactured by SAN-APRO LIMITED) was used as a curing accelerator in an amount of 1 phr relative to the epoxy resin. Curing conditions were a precure at 100° C. for two hours and a postcure at 180° C. for three hours.

(Measurement of Glass Transition Temperature (Tg))

Glass transition temperature was measured at a temperature-raising rate of 10° C./min by a penetration method by TMA (Thermal Mechanical Analysis). A peak temperature of Tanδ was measured at a temperature-raising rate of 2° C./min by DMA (dynamic viscoelasticity).

(Measurement of Bending Properties)

Bending properties were measured by means of a tensile testing machine in accordance with JIS K-6911.

A height and width of a test piece were measured; the test piece was supported and a load was exerted in the center thereof by a pressure wedge; and a load was measured at breakage of the test piece to calculate a flexural strength (σ). Symbols used are as follows: flexural strength σ: (MPa) {kgf/mm$^2$}, P: load at breakage of the test piece (N) {kgf}, L: distance between supports (mm), W: width of test piece (mm), and h: height of test piece (mm).

$$\sigma=(3PL)/(2Wh^2)$$

Flexural modulus (E): (MPa) {kgf/mm$^2$} is calculated according to the below equation where F/Y: slope (N/mm) {kgf/mm} of a straight-line portion of a load-deflection curve.

$$E=[L^3/(4Wh^3)]\times[F/Y]$$

(Measurement of Boiling Water Absorption Percentage)

Measurement was carried out based on JIS K-6911.

A test piece was subjected to a drying treatment for 24 hours in a thermostatic oven kept at 50° C. The test piece treated was cooled in a desiccator to 20° C. and a weight thereof was measured. The test piece was put in boiling distilled water; it was boiled for one hour; it was taken out from the water; it was cooled in running water at 20° C. for 30 minutes; moisture was wiped off from the test piece; a weight was measured immediately after absorption of water. Furthermore, the same measurement was carried out except that the boiling time was changed to 100 hours.

$$A=[(W_2-W_1)/W_1]\times100$$

where A: boiling water absorption percentage (%), $W_1$: weight (g) of the test piece before boiling, $W_2$: weight (g) of the test piece after boiling.

(Measurement of All Light Transmittance)

Measurement was carried out based on JIS K-7105.

A transmission amount of all light was measured by means of an integrating sphere-type measuring apparatus to determine an all light transmittance.

A standard white plate was fixed and an amount of incident light was controlled so that an indication of the apparatus was set to 100 ($T_1$). A test piece was fixed and an all light transmittance ($T_2$) was measured, in a fixed state of the standard white plate. The all light transmittance (Ti) was determined based on (Ti)=($T_2$).

Example 1

10 g (00.67 eq) of the liquid modified epoxy resin composition synthesized in Synthesis Example 1 was dissolved in 5.6 g (0.0335 eq) of methylhexahydrophthalic anhydride to prepare a sample for the storage stability test. The initial viscosity by the E-type viscometer was 140 mPa·s at 60° C.; the composition was stored under stirring at room temperature and the fluidity was lost due to crystallization after 55 days.

Furthermore, 20 g (0.134 eq) of the liquid epoxy resin composition synthesized in Synthesis Example 1 and 22.5 g (0.134 eq) of methylhexahydrophthalic anhydride were mixed and dissolved at 100° C. under deaeration. Then 0.2 g of triphenylbenzylphosphonium bromide (SA5003: manufactured by SA-APRO LIMITED) was added and dissolved as a curing accelerator, and the solution thus prepared was poured and cast into a die in which a spacer was sandwiched between glass plates preliminarily subjected to a mold-releasing treatment. Thereafter, a precure was carried out at 100° C. for two hours and a postcure was then carried out at 180° C. for three hours to obtain a cast-molded plate. Cured product properties were measured with this cast-molded plate.

Tg by TMA was 197° C.; Tg by DNA was 197° C.; the flexural strength was 50 MPa; the flexural modulus was 3200 MPa; the boiling water absorption percentage (after boiling for one hour) was 0.71; the boiling water absorption percentage (after boiling for 100 hours) was 2.6; and the all light transmittance was 93.6%.

Example 2

10 g (0.063 eq) of the liquid modified epoxy resin composition synthesized in Synthesis Example 2 was dissolved in 5.29 g (0.0315 eq) of methylhexahydrophthalic anhydride to prepare a sample for the storage stability test. The initial viscosity by the E-type viscometer was 135 mPa·s at 60° C.; the composition was stored under stirring at room temperature and no phenomenon of decrease in the fluidity due to crystallization was observed even after passage of at least 100 days.

Furthermore, 20 g (0.126 eq) of the modified liquid epoxy resin composition synthesized in Synthesis Example 2 and 21.2 g (0.126 eq) of methylhexahydrophthalic anhydride were mixed and dissolved at 100° C. under deaeration. Then 0.2 g of triphenylbenzylphosphonium bromide (SA5003: manufactured by SAN-APRO LIMITED) was added and dissolved as a curing accelerator, and the solution thus prepared was poured and cast into a die in which a spacer was sandwiched between glass plates preliminarily subjected to a mold-releasing treatment. Thereafter, a precure was carried out at 100° C. for two hours and a postcure was then carried out at 180° C. for three hours to obtain a cast-molded plate. Cured product properties were measured with this cast-molded plate.

Tg by TMA was 187° C.; Tg by DMA was 192° C; the flexural strength was 82 MPa; the flexural modulus was 3300 MPa; the boiling water absorption percentage (after boiling for one hour) was 0.70; the boiling water absorption percentage (after boiling for 100 hours) was 2.3; and the all light transmittance was 92.3%.

Example 3

10 g (0.058 eq) of the liquid modified epoxy resin composition synthesized in Synthesis Example 3 was dissolved in 4.87 g (0.029 eq) of methylhexahydrophthalic anhydride to prepare a sample for the storage stability test. The initial viscosity by the E-type viscometer was 120 mPa·s at 60° C.; the composition was stored under stirring at room temperature and no phenomenon of decrease in the fluidity due to crystallization was observed even after passage of at least 100 days.

Furthermore, 20 g (0.116 eq) of the liquid modified epoxy resin composition synthesized in Synthesis Example 3 and 19.5 g (0.116 eq) of methylhexahydrophthalic anhydride were mixed and dissolved at 100° C. under deaeration. Then 0.2 g of triphenylbenzylphosphonium bromide (SA5003: manufactured by SAN-APRO LIMITED) was added and dissolved as a curing accelerator, and the solution thus prepared was poured and cast into a die in which a spacer was sandwiched between glass plates preliminarily subjected to a mold-releasing treatment. Thereafter, a precure was carried out at 100° C. for two hours and a postcure was then carried out at 180° C. for three hours to obtain a cast-molded plate. Cured product properties were measured with this cast-molded plate.

Tg by TMA was 180° C.; Tg by DMA was 185° C.; the flexural strength was 84 MPa; the flexural modulus was 3100 MPa; the boiling water absorption percentage (after boiling for one hour) was 0.65; the boiling water absorption percentage (after boiling for 100 hours) was 2.0; and the all light transmittance was 93.5%.

Example 4

10 g (0.060 eq) of the liquid modified epoxy resin composition synthesized in Synthesis Example 4 was dissolved in 5.0 g (0.030 eq) of methylhexahydrophthalic anhydride to prepare a sample for the storage stability test. The initial viscosity by the E-type viscometer was 100 mPa·s at 60° C.; the composition was stored under stirring at room temperature and the fluidity was lost due to crystallization after 50 days.

Furthermore, 20 g (0.120 eq) of the liquid modified epoxy resin composition synthesized in Synthesis Example 4 and 20.2 g (0.120 eq) of methylhexahydrophthalic anhydride were mixed and dissolved at 100° C. under deaeration. Then 0.2 g of triphenylbenzylphosphonium bromide SA5003: manufactured by SAN-APRO LIMITED) was added and dissolved as a curing accelerator, and the solution thus prepared was poured and cast into a die in which a spacer was sandwiched between glass plates preliminarily subjected to a mold-releasing treatment. Thereafter, a precure was carried out at 100° C. for two hours and a postcure was then carried out at 180° C. for three hours to obtain a cast-molded plate. Cured product properties were measured with this cast-molded plate.

Tg by TMA was 185° C.; Tg by DMA was 190° C.; the flexural strength was 84 MPa; the flexural modulus was 2800 MPa; the boiling water absorption percentage (after boiling for one hour) was 0.68; the boiling water absorption percentage (after boiling for 100 hours) was 1.8; and the all light transmittance was 92.6%.

Example 5

10 g (0.055 eq) of the liquid modified epoxy resin synthesized in Synthesis Example 5 was dissolved in 4.87 g (0.0275 eq) of methylhexahydrophthalic anhydride to prepare a sample for the storage stability test. The initial viscosity by the E-type viscometer was 150 mPa·s at 60° C.; the composition was stored under stirring at room temperature and no phenomenon of decrease in the fluidity due to crystallization was observed even after passage of at least 100 days.

Furthermore, 20 g (0.110 eq) of the modified liquid epoxy resin synthesized in Synthesis Example 5 and 18.5 g (0.110 eq) of methylhexahydrophthalic anhydride were mixed and dissolved at 100° C. under deaeration. Then 0.2 g of triphenylbenzylphosphonium bromide (SA5003: manufactured by SAN-APRO LIMITED) was added and dissolved as a curing accelerator, and the solution thus prepared was poured and cast into a die in which a spacer was sandwiched between glass plates preliminarily subjected to a mold-releasing treatment. Thereafter, a precure was carried out at 100° C. for two hours and a postcure was then carried out at 180° C. for three hours to obtain a cast-molded plate. Cured product properties were measured with this cast-molded plate.

Tg by TMA was 180° C.; Tg by DWIA was 181° C.; the flexural strength was 80 MPa; the flexural modulus was 2820 MPa; the boiling water absorption percentage (after boiling for one hour) was 0.65; the boiling water absorption percentage (after boiling for 100 hours) was 1.6; and the all light transmittance was 94.0%.

Comparative Example 1

10 g (0.098 eq) of α-type tris-(2,3-epoxypropyl)-isocyanurate (epoxy value: 9.95 eq/kg) was dissolved in 8.23 g (0.049 eq) of methylhexahydrophthalic anhydride to prepare a sample for the storage stability test. The initial viscosity by the E-type viscometer was 125 mPa·s at 60° C.; and the composition was stored under stirring at room temperature and the fluidity was lost due to crystallization after one day.

Furthermore, 20 g (0.196 eq) of α-type tris-(2,3-epoxypropyl)-isocyanurate (epoxy value: 9.95 eq/kg) and 32.9 g (0.196 eq) of methylhexahydrophthalic anhydride were mixed and dissolved at 100° C. under deaeration. Then 0.2 g of triphenylbenzylphosphonium bromide (SA5003: manufactured by SAN-APRO LIMITED) was added and dissolved as a curing accelerator, and the solution thus prepared was poured and cast into a die in which a spacer was sandwiched between glass plates preliminarily subjected to a mold-releasing treatment. Thereafter, a precure was carried out at 100° C. for two hours and a postcure was then carried out at 180° C. for three hours to obtain a cast-molded plate. Cured product properties were measured with this cast-molded plate.

Tg by TMA was 215° C.; Tg by DMA was 225° C.; the flexural strength was 50 MPa; the flexural modulus was 3400 MPa; the boiling water absorption percentage (after boiling for one hour) was 0.74; the boiling water absorption percentage (after boiling for 100 hours) was 3.3; and the all light transmittance was 93.9%.

Comparative Example 2

10 g (0.071 eq) of the liquid modified epoxy resin synthesized in Synthesis Example 6 was dissolved in 5.96 g (0.3355 eq) of methylhexahydrophthalic anhydride to prepare a sample for the storage stability test. The initial viscosity by the E-type viscometer was 200 mPa·s at 60° C.; the composition was stored under stirring at room temperature and the fluidity was lost due to crystallization after 5 days.

Furthermore, 20 g (0.142 eq) of the liquid modified epoxy resin synthesized in Synthesis Example 6 and 23.9 g (0.142 eq) of methylhexahydrophthalic anhydride were mixed and dissolved at 100° C. under deaeration. Then 0.2 g of triphenylbenzylphosphonium bromide (SA5003: manufactured by SAN-APRO LIMITED) was added and dissolved as a curing accelerator, and the solution thus prepared was poured and cast into a die in which a spacer was sandwiched between glass plates preliminarily subjected to a mold-releasing treatment. Thereafter, a precure was carried out at 100° C. for two hours and a postcure was then carried out at 180° C. for three hours to obtain a cast-molded plate. Cured product properties were measured with this cast-molded plate.

Tg by TMA was 200° C.; Tg by DMA was 205° C.; the flexural strength was 71 MPa; the flexural modulus was 3080 MPa; the boiling water absorption percentage (after boiling for one hour) was 0.75; the boiling water absorption percentage (after boiling for 100 hours) was 3.8; and the all light transmittance was 93.9%.

Comparative Example 3

10 (0.064 eq) of the liquid modified epoxy resin synthesized in Synthesis Example 7 was dissolved in 5.38 g (0.032 eq) of methylhexahydrophthalic anhydride to prepare a sample for storage stability test. The initial viscosity by the E-type viscometer was 330 mPa·s at 60° C.; the composition was stored under stirring at room temperature and the fluidity was lost due to gelation after 5 days.

Furthermore, 20 g (0.128 eq) of the liquid modified epoxy resin synthesized in Synthesis Example 7 and 21.5 g (0.128 eq) of methylhexahydrophthalic anhydride were mixed and dissolved at 100° C. under deaeration. Then 0.2 g of triphenylbenzylphosphonium bromide (SA5003: manufactured by SAN-APRO LIMITED) was added as a curing accelerator and a curing reaction rapidly proceeded so that it was difficult to obtain a cured product.

Comparative Example 4

The white solid substance synthesized in Synthesis Example 8 was insoluble and unmelted in a solvent, and no cured product was obtained.

The liquid modified epoxy resin compositions of Examples 1 to 5 were excellent in the storage stability and showed better results of the cured product properties of mechanical strength and water absorption than the cured product of tris-(2,3-epoxypropyl)i-isocyanurate.

In Comparative Example 1, α-type tris-(2,3-epoxypropyl)-isocyanurate had high crystallinity, and even in a solution adjusted to (equivalent of methylhexahydrophthalic anhydride)/(equivalent of α-type tris-(2,3-epoxypropyl)-isocyanurate)=0.5, crystals precipitated to lose fluidity in one day. The epoxy resin composition underwent component separation due to the precipitation of crystals and failed to have sufficient strength.

In Comparative Example 2, a part of α-type tris-(2,3-epoxypropyl)-isocyanurate was modified with acetic acids but the storage stability was poor and the water absorption of the cured product became high because of hydroxyl groups remaining in the cured structure.

In Comparative Example 3, the isocyanurate was modified with an excessive amount of acetic acid more than in Comparative Example 2, but the curing reaction rapidly proceeded in a stage of adding a catalyst after mixing with methylhexahydrophthalic anhydride as an acid anhydride curing agent to dissolve the mixture. It was thus difficult to obtain a cured product. It is because hydroxyl groups produced by modification with acetic acid existed excessively and promoted the curing reaction with methylhexahydrophthalic anhydride.

In Comparative Example 4, a part of α-type tris-(2,3-epoxypropyl)-isocyanurate was modified with propionic acids but the product thus obtained was insoluble and unmelted in a solvent, to result in failing to obtain a cured product.

INDUSTRIAL APPLICABILITY

The modified epoxy resin composition of the present invention has excellent heat resistance inherent to the crystalline epoxy resin, and excellent cured product properties, is applicable in the liquid case to liquid epoxy resins for potting and for casting, and is applicable in the solid case to transfer molding.

The entire disclosure of Japanese Patent Application No. 2004-283094 filed on Sep. 29, 2004 including the specification, claims and summary is incorporated herein by reference in its entirety.

The invention claimed is:
1. A modified epoxy resin composition, comprising:
a component (A) which is a mixture of compounds resulting from replacement of one glycidyl group, two glycidyl groups, and three glycidyl groups of α-type tris-(2,3-epoxypropyl)-isocyanurate with a melting point of from 98 to 107° C. with a functional group represented by formula (1) and prepared by adding acid anhydrides of formula (2):

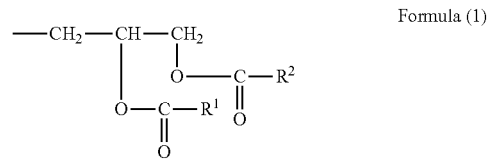

wherein
each of $R^1$ and $R^2$ is an alkyl group, an alkenyl group, an alkynyl group, an aryl group, an aralkyl group, a heterocyclic group, or a halogenated, aminated or nitrated derivative thereof; and
a compound (B) which is an α-type tris-(2,3-epoxypropyl-isocyanurate with a melting point of from 98 to 107° C.;
wherein a molar ratio of the component (A) to the compound (B) is from 3.33/1 to 2/3
the modified epoxy resin composition is a liquid which is stable for at least 50 days at room temperature,
a total number of glycidyl groups per molecule in component (A) and compound (B) is at least two on average of a total number of (A) and (B) molecules.

2. A process for producing the modified epoxy resin composition as defined in claim 1, comprising:
reacting compound (B) with an acid anhydride;
wherein a molar ratio of glycidyl group in the compound (B) to the acid anhydride is from 10/1 to 2/1.

3. The modified epoxy resin composition according to claim 1, wherein compound (B) has n glycidyl groups in its molecule and n is 3.

4. A modified epoxy resin composition, comprising:
a compound (A) which is a compound resulting from replacement of an α-type glycidyl group of tris-(2,3-epoxypropyl)-isocyanurate with a melting point of from 98 to 107° C. with a functional group represented by formula (1):

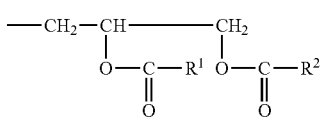

Formula (1)

wherein
each of $R^1$ and $R^2$ is an alkyl group, an alkenyl group, an alkynyl group, an aryl group, an aralkyl group, a heterocyclic group, or a halogenated, aminated or nitrated derivative thereof wherein at least one of $R^1$ and $R^2$ is an alkynyl group or a halogenated, aminated or nitrated derivative of a group selected from the group consisting of an alkyl group, an alkenyl group, an alkynyl group, an aryl group, an aralkyl group, and a heterocyclic group; and a compound (B) wherein the compound (B) is an α-type tris-(2,3-epoxypropyl)-isocyanurate with a melting point of from 98 to 107° C.;
wherein
the modified epoxy resin composition is a liquid which is stable for at least 50 days at room temperature,
a total number of glycidyl groups per molecule in compounds (A) and (B) is at least two on average of a total number of (A) and (B) molecules.

5. The modified epoxy resin composition according to claim 4, wherein at least one of $R^1$ and $R^2$ is an alkynyl group.

6. The modified epoxy resin composition according to claim 4, wherein at least one of $R^1$ and $R^2$ is a halogenated, aminated or nitrated derivative of an alkyl group.

7. The modified epoxy resin composition according to claim 4, wherein at least one of $R^1$ and $R^2$ is a halogenated, aminated or nitrated derivative of an alkenyl group.

8. The modified epoxy resin composition according to claim 4, wherein at least one of $R^1$ and $R^2$ is a halogenated, aminated or nitrated derivative of an alkynyl group.

9. The modified epoxy resin composition according to claim 4, wherein at least one of $R^1$ and $R^2$ is a halogenated, aminated or nitrated derivative of an aryl group.

10. The modified epoxy resin composition according to claim 4, wherein at least one of $R^1$ and $R^2$ is a halogenated, aminated or nitrated derivative of an aralkyl group.

11. The modified epoxy resin composition according to claim 4, wherein at least one of $R^1$ and $R^2$ is a halogenated, aminated or nitrated derivative of a heterocyclic group.

* * * * *